US006873145B2

(12) United States Patent
Belmont et al.

(10) Patent No.: US 6,873,145 B2
(45) Date of Patent: Mar. 29, 2005

(54) METHOD FOR MAKING A CARD WITH MULTIPLE CONTACT TIPS FOR TESTING MICROSPHERE INTEGRATED CIRCUITS, AND TESTING DEVICE USING SAID CARD

(75) Inventors: André Belmont, La Batie Divisin (FR); Laurent Robert, Voiron (FR); Abdel Nacer Ait Mani, Saint Martin d'Hères (FR)

(73) Assignee: Mesatronic, Voiron (FR)

( * ) Notice: Subject to any disclaimer, the term of this patent is extended or adjusted under 35 U.S.C. 154(b) by 138 days.

(21) Appl. No.: 10/070,833

(22) PCT Filed: Jul. 24, 2001

(86) PCT No.: PCT/FR01/02411
§ 371 (c)(1),
(2), (4) Date: Mar. 11, 2002

(87) PCT Pub. No.: WO02/10779
PCT Pub. Date: Feb. 7, 2002

(65) Prior Publication Data
US 2002/0121912 A1 Sep. 5, 2002

(30) Foreign Application Priority Data
Jul. 28, 2000 (FR) .......................................... 00 09930

(51) Int. Cl.[7] .......................... H01R 43/00; H05K 3/00; H05K 3/02
(52) U.S. Cl. ........................ 324/158.1; 29/825; 29/846; 29/842
(58) Field of Search ............................. 324/158.1, 754, 324/765; 29/825, 846, 847, 842; 427/96

(56) References Cited
U.S. PATENT DOCUMENTS
3,716,428 A * 2/1973 Amouroux et al. ......... 438/656

6,289,583 B1    9/2001  Belmont et al.
6,305,230 B1   10/2001  Kasukabe et al.
6,591,491 B2 *  7/2003  Fujii et al. ..................... 29/830
6,662,442 B1 * 12/2003  Matsui et al. ................. 29/852

FOREIGN PATENT DOCUMENTS

| EP | 0 772 049 A2 | 5/1997 |
| EP | 0 999 451 A2 | 5/2000 |
| WO | WO 98/45716 | 10/1998 |
| WO | WO 98/52218 | 11/1998 |

OTHER PUBLICATIONS

Kondoh Y et al., "Universal Membrane Probe For Known Good Die", International Journal of Microcircuits and Electronic Packaging, US, International Microelectronics & Packaging Society, vol. 17, No. 4, pp. 323–329, Oct. 1994.

* cited by examiner

Primary Examiner—David Zarneke
Assistant Examiner—Russell M. Kobert
(74) Attorney, Agent, or Firm—Oliff & Berridge, PLC

(57) ABSTRACT

The invention concerns a method for making a card with tips for testing semiconductor chips with microsphere bond pads. A first adhesive coat is vacuum deposited on a flexible polyimide film, followed by a second metal coat. A combination of UV photolithography and electroforming of a metal material enables to obtain the implantation of the tips. The pattern of the strip conductors is obtained by a second UV lithography operation whereby the second metal layer and the first adhesive coat are etched. An insulating protective resist is deposited on the active conductive zone. The flexible film is mounted on a truncated maintaining component whereof the vertical translational and planar rotational movements are made possible by a guide supported on a spring suspension. The defective alignment between the plane of the tips and the plane of the tips and the printed circuit plane is corrected by a correcting system with three support points adjustable with screws.

5 Claims, 6 Drawing Sheets

METHOD FOR MAKING A CARD WITH MULTIPLE CONTACT TIPS FOR TESTING MICROSPHERE INTEGRATED CIRCUITS, AND TESTING DEVICE USING SAID CARD

BACKGROUND OF THE INVENTION

The invention relates to a card with multiple tips designed in particular for testing semiconductor chips having connection pads in the form of microspheres, said card comprising a substrate formed by a flexible insulating film equipped with conducting tracks connected to contacts in the form of tips.

STATE OF THE TECHNIQUE

It is state-of-the-art to fabricate test cards with tips on flexible substrates made of insulating material, for example a polyimide film, that acts as support for both the conducting tracks and the tips.

According to the documents U.S. Pat. No. 5,412,866 and U.S. Pat. No. 4,980,637, the flexible membrane presents a convex shape and an elastomer mattress is arranged at the rear of the membrane so as to obtain flatness of the ends of the tips.

According to the document U.S. Pat. No. 5,914,613, the contacts of the card are mounted on rigid girders electrically connected to flexible conductors. An elastomer mattress is also located at the rear of the flexible membrane.

In the device described in the document EP 259,163, a polyimide film is cut and shaped as a truncated pyramidal head. Elastic plastic plates are located between the film and a fixed support to check the contact pressure of the tips on the connection pads of the chip to be tested.

The document WO 98/45716 describes a fabrication process of a test card the tips whereof are achieved by electroforming on a rigid substrate for example made of AsGa, quartz or glass. Such a process enables a distribution of the tips with high density and fine pitch to be achieved in the contact area.

OBJECT OF THE INVENTION

A first object of the invention is to achieve a test card on a flexible insulating substrate acting both as damper and support for the conducting tracks and tips and enabling a sufficient deformation to be obtained to distribute the contact pressure of the tips uniformly on the connection pads of the chip with a pure frictionless vertical force.

The second object of the invention is to achieve reliable correction of the alignment fault between the plane of the test tips and its support printed circuit.

A fabrication process of a card with multiple tips according to the invention is characterized by the following stages:

- a first adhesive metal layer of small thickness is deposited on the flexible film made of insulating material,
- a second metal layer is deposited by vacuum or electrolysis on the first adhesive layer to form the material of the future conducting tracks,
- the metal tips are achieved by a combination of a first UV photolithography operation making use of a thick photosensitive resin and electroforming by means of a metal-ion electrolyte,
- selective etching of the second metal layer and of the first adhesive layer is performed by means of a second UV photolithography operation to obtain the conducting tracks, and a superficial passivation insulating layer is deposited on the active conducting area.

The flexible film of the substrate is a polymer, in particular a polyimide, having a thickness greater than 25 microns. Such a thickness enables the required deformation to be obtained and a high density of tips to be supported. The first adhesive metal layer is chrome- or nickel-based whereas the second metal layer can be made of copper, gold or aluminium.

According to one feature of the invention, the flexible film is mounted on a truncated part of a support part operating in conjunction with a guide associated to a spring suspension so as to obtain a uniform distribution of the contact pressure of the tips on all the connection pads without lateral friction. The tips obtained by electroforming can present flat, concave or convex contact surfaces. Correction of the alignment fault between the plane of the support printed circuit and the plane of the tips is performed by means of a correcting system with three support points adjustable by screws acting on the base of the support part.

According to a preferred embodiment, the support part comprises a cylindrical intermediate part arranged coaxially inside the guide and having a diameter smaller than that of the base. The truncated part of the support part is provided with a window equipped with a plate made of transparent material, glass or quartz, allowing visual testing of the alignment of the tips on the connection pads of the semiconductor chip.

DESCRIPTION OF THE DRAWINGS

Other advantages and features will become more clearly apparent from the following description of an embodiments of the invention given for non-restrictive example purposes only and represented in the accompanying drawings, in which.

DESCRIPTION OF A PREFERRED EMBODIMENT

Figure 1:
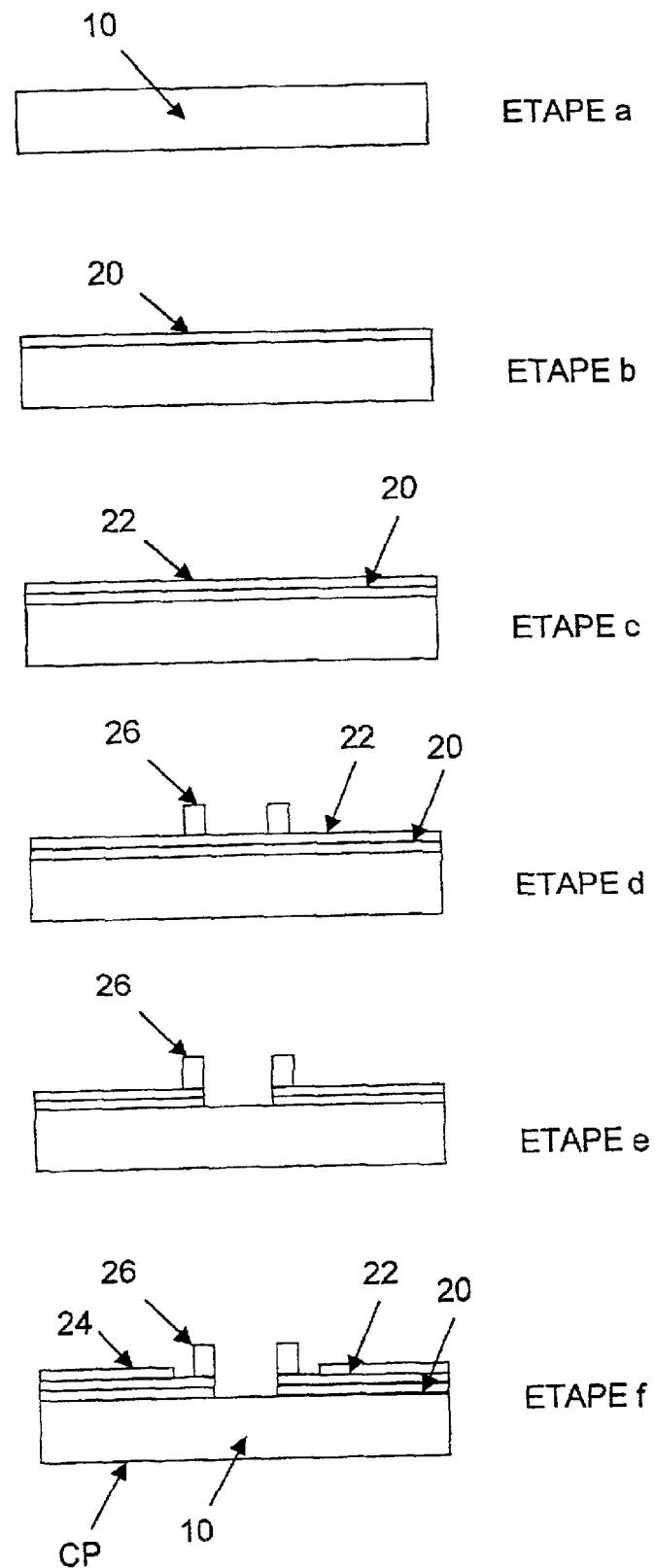
FIG. 1 shows the different stages a-f of the fabrication process of the card with tips on the flexible substrate according to the invention.

FIG. 1 illustrates the technological stages implemented to fabricate the card CP with tips on a deformable flexible substrate.

Stage a: a flexible film of insulating material, for example polyimide, having a thickness of about 25 microns is used as substrate 10.

Stage b: a first adhesive metal layer 20, in particular chrome- or nickel-based, is deposited on the whole surface of the insulating substrate 10. Deposition of the layer 20 is performed by vacuum evaporation or by cathode sputtering. In the example illustrated in FIG. 1, the working face is the upper face but it can be conceived to work on both faces.

Stage c: a second metal layer 22 constituting the future conducting tracks of the card is then deposited on the adhesive layer 20. The second layer 22 can be made of copper, gold or aluminium and is deposited either as a thin film in a vacuum or in a thicker layer by electrolysis for example.

Stage d: a first UV photolithography operation is performed after a thick layer of photosensitive resin has been deposited on the second metal layer, which resin is revealed after being insulated through a mask comprising the pattern of the tips. The photolithography operation is followed by an electroforming operation consisting in fabricating the tips 26 in the form of metal pads by use of an electrolyte.

Stage e: a second UV photolithography operation enables the second metal layer 22 and the first adhesive layer 20 to be etched according to the required plotting of the tracks and the shape of the tips 26 achieved.

It is clear that the order of succession of stages d and e can be reversed.

Stage f: an insulating passivation layer 24 is deposited on the active conducting area.

Figure 5:
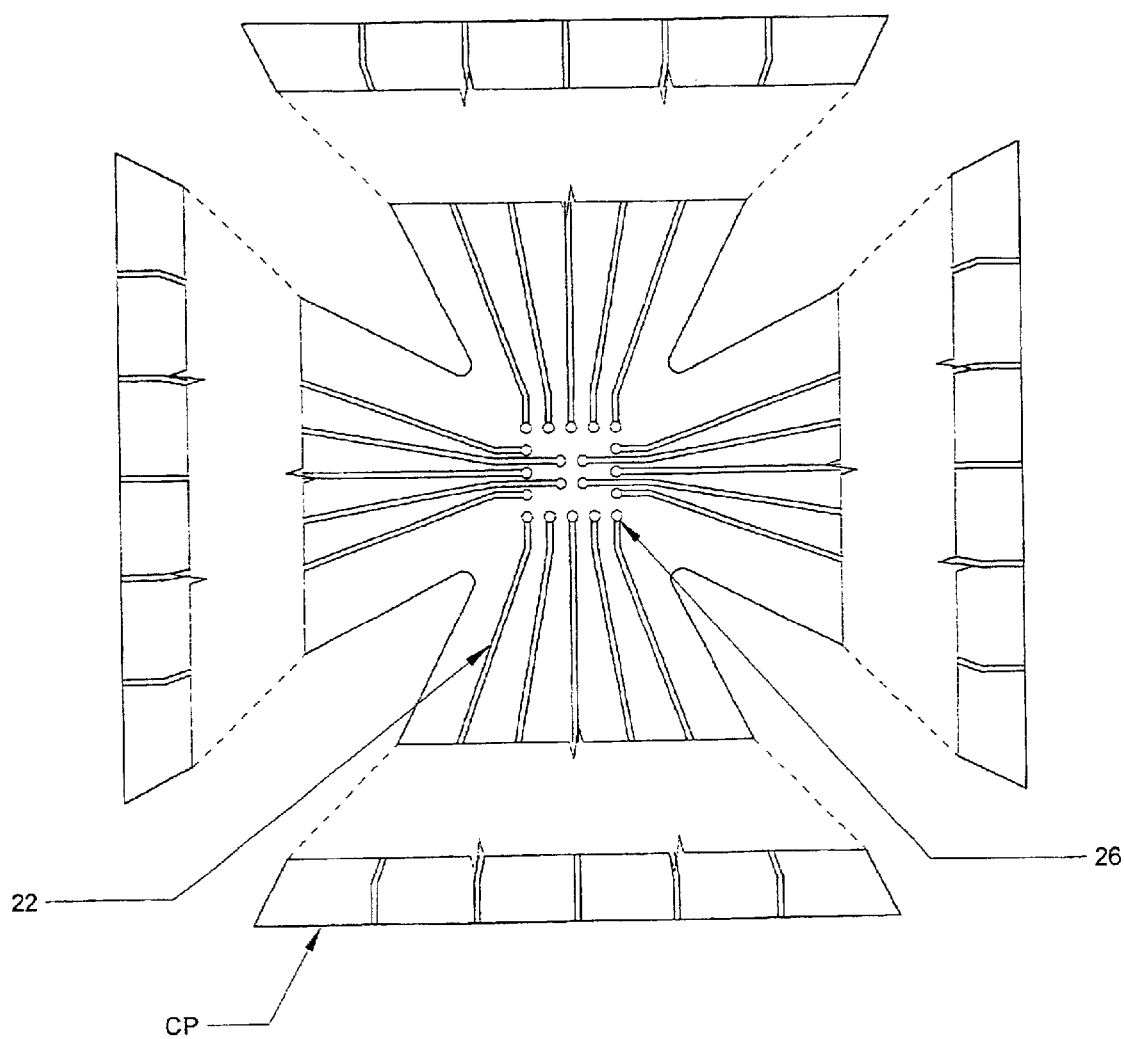
FIG. 5 represents a plan view of the card illustrated in stage f of FIG. 1.

The layer 24 is composed of an oxide or a polymer in a thin layer deposited locally and serves the purpose of protecting the conducting tracks reducing the problems linked to fouling of the tips when testing. FIG. 5 shows the plan view of the card CP at the end of fabrication.

Figure 2A:
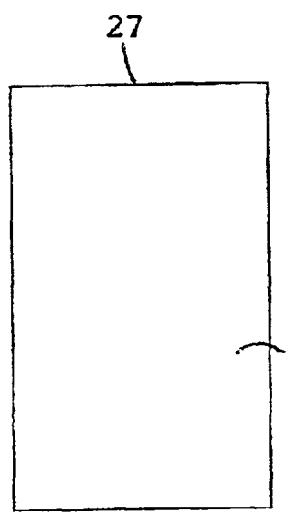
FIGS. 2A, 2B, 2C represent different shapes of surfaces of the tips of the card according to the invention.
Figure 2B:
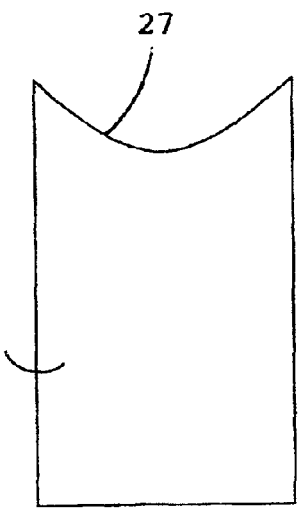
Figure 2C:
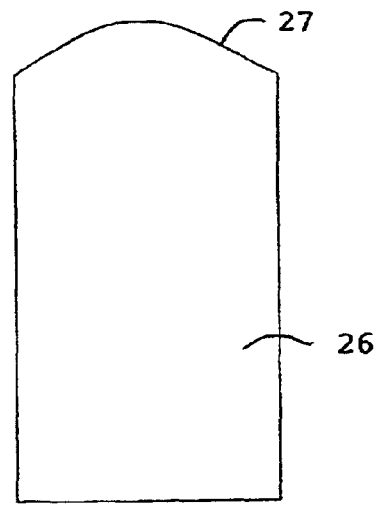

With reference to FIGS. 2A, 2B, 2C, the upper surface 27 of the electrodeposited tips 26 coming into contact with the microspheres to be tested can have different shapes so as not to damage the microspheres. In FIG. 2A, the upper surface 27 is flat. In FIG. 2B, the upper surface 27 is concave to follow the complementary shape of the microsphere exactly. In FIG. 2C, the upper surface 27 has a convex profile.

Figure 3:
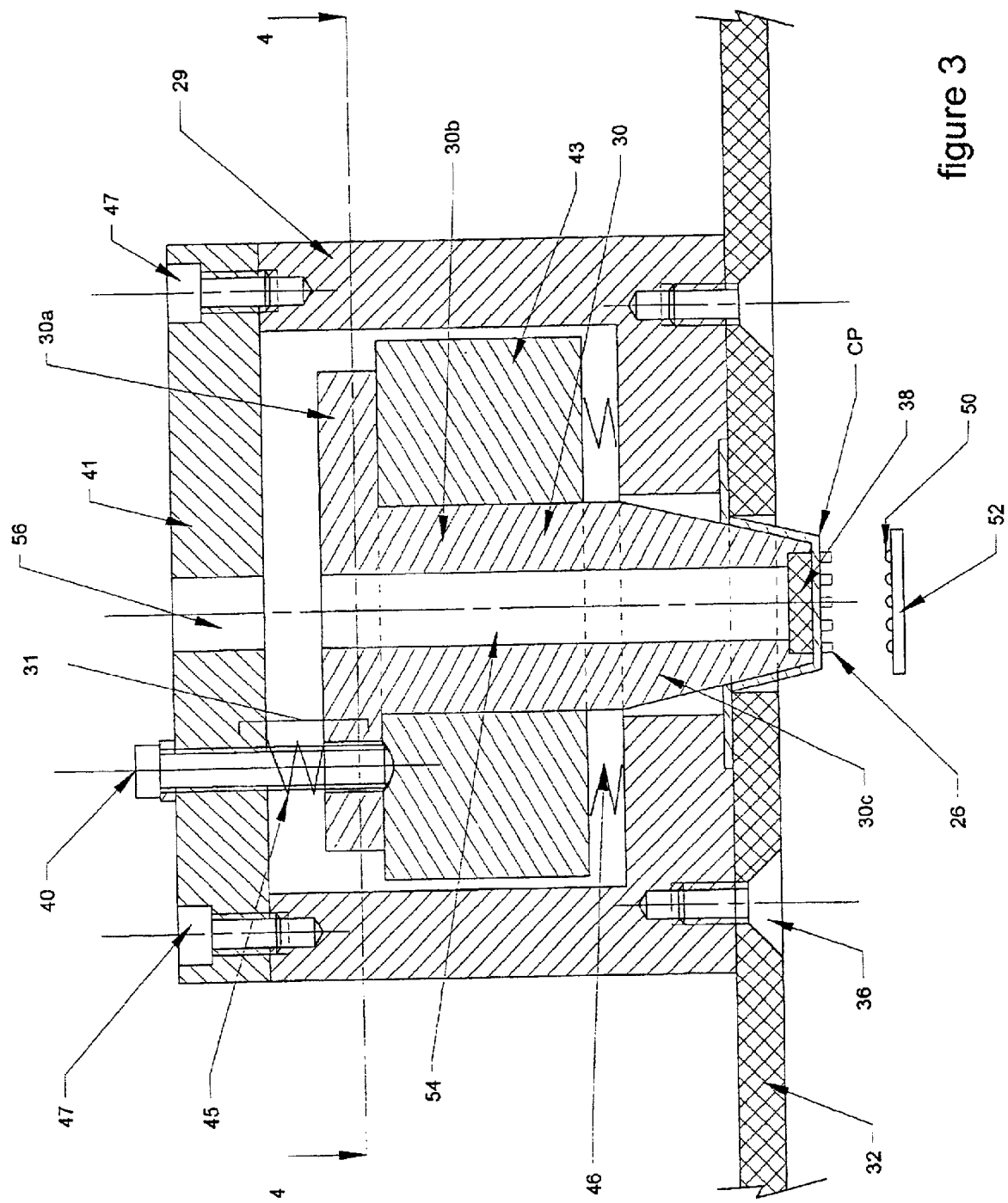
FIG. 3 is a cross-section view of the complete test assembly.
Figure 4:
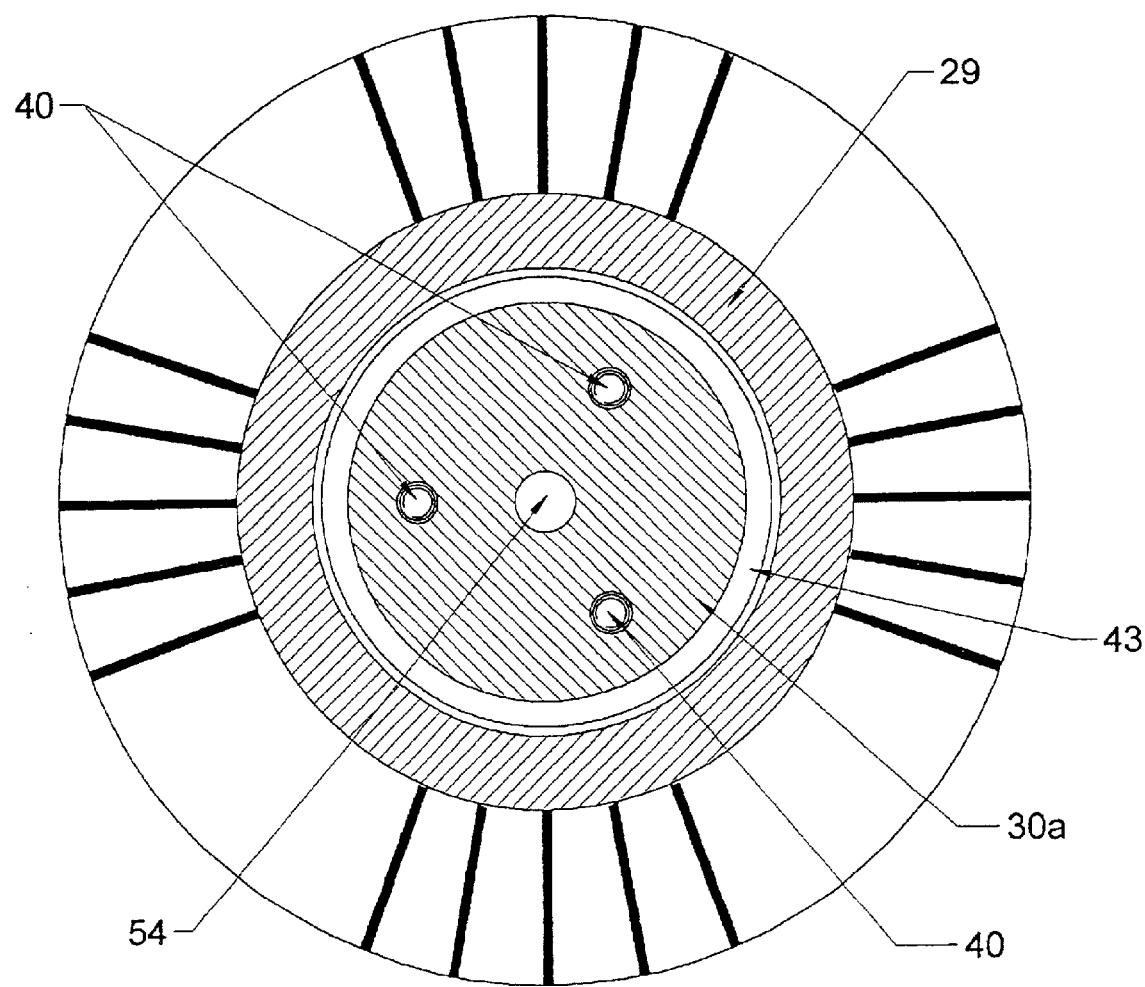
FIG. 4 is a longitudinal sectional view along the line 4—4 of FIG. 3 at the level of the adjustment function.
Figure 6:
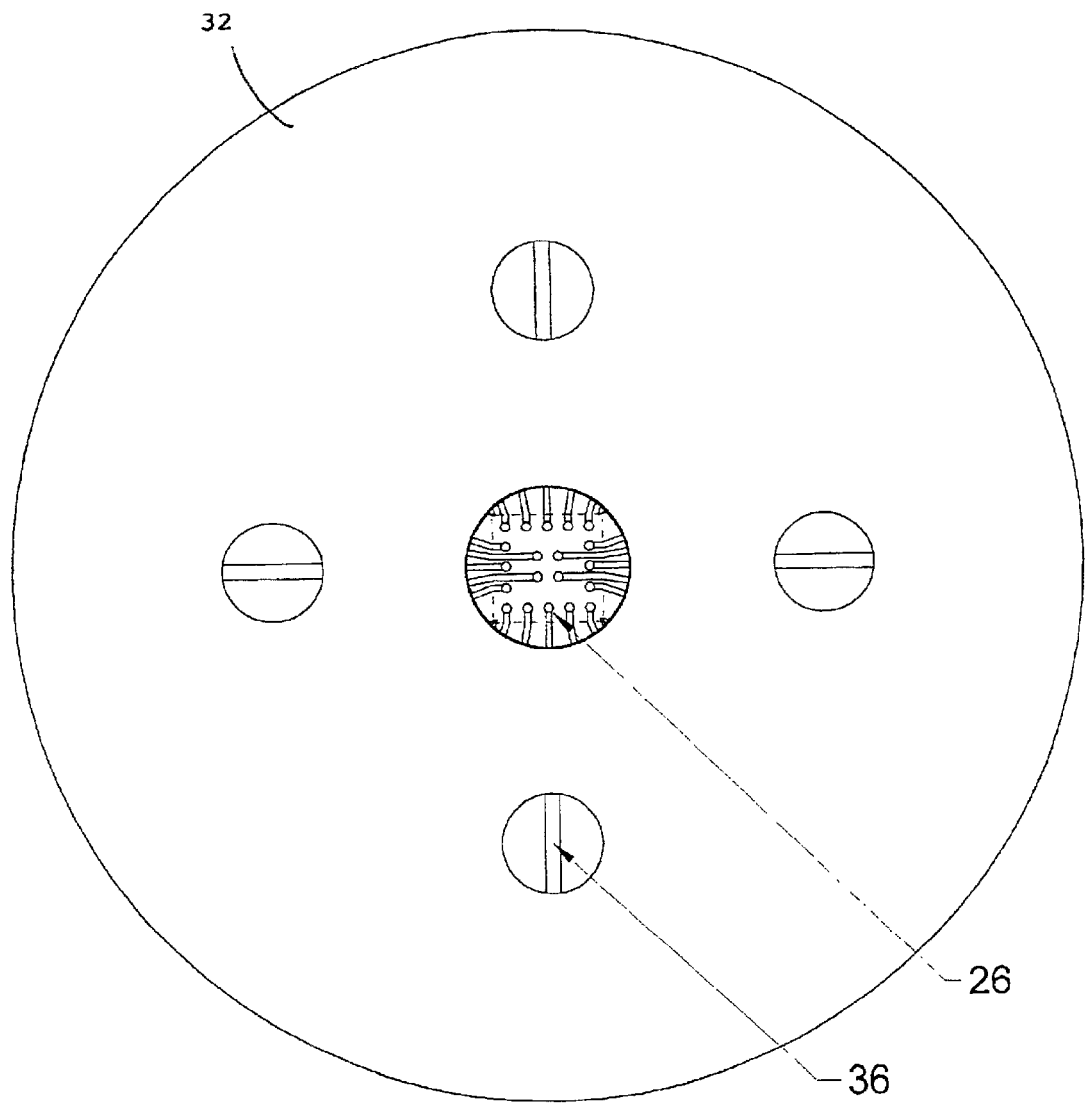
FIG. 6 is a bottom view of FIG. 3.

In FIGS. 3, 4 and 6, the flexible substrate 10 is mounted on a support device 29 equipped with a correcting system 31 for correcting alignment faults using support means adjustable at three points.

The flexible substrate 10 is fixed onto a central support part 30 designed to move coaxially in a guide 43. The support part 30 comprises a base 30a, a cylindrical intermediate part 30b arranged coaxially inside the annular guide 29, and a truncated part 30c on which the flexible substrate 10 is fitted. Electrical contact between the conducting tracks of the card 10 and the printed circuit 32 is ensured by pressing by means of assembly screws 36 screwed into the support 29. The relative movement of the mobile part 30 in the guide 43 takes place in vertical translation or in rotation around the vertical axis.

The alignment fault between the plane of the tips 26 and the printed circuit 32 is corrected by the correcting system 31 by means of three adjustment screws 40 angularly offset by 120 degrees. The screws 40 pass through the cover 41 and first springs 45 are inserted between the bottom face of the cover 41 and the circular base 30a that presses on the upper face of the guide 43. A second spring 46 is arranged in the opposite gap arranged between the bottom face of the guide 43 and the support device 29. The cover 41 is fitted on the support 29 by screws 47 and the base 30a presents a diameter greater than that of the intermediate part 30b of the part 30.

The alignment of the tips 26 on the connection pads 50 of the semi-conductor chip 52 to be tested is visual and is performed by means of a window 38 equipped with a plate made of transparent material, glass or quartz, that is arranged facing openings 54, 56 aligned coaxially in the truncated part 30 and the cover 41.

Contact of the tips 26 with the connection pads 50 of the chip 52 takes place without notable lateral friction so as to prevent wear of the pads. The flexibility of the flexible film of the substrate 10 acts both as a damper absorbing the compression forces during the test operation and as distributor of the contact pressure over all the spherical connection pads 50 of the chip 52.

What is claimed is:

1. A process for manufacturing a card with multiple tips for testing semi-conductor chips having connection pads in the form of microspheres, said card comprising a substrate (10) formed by a flexible insulating film equipped with conducting tracks connected to contacts in the form of tips (26), wherein:

a first adhesive metal layer (20) of small thickness is deposited on the flexible film made of insulating material, a second metal layer (22) is deposited by vacuum or electrolysis on the first adhesive layer (20) to form the material of the future conducting tracks, the metal tips (26) are achieved by a combination of a first UV photolithography operation making use of a thick photosensitive resin and electroforming by means of a metal-ion electrolyte, selective etching of the second metal layer (22) and of the first adhesive layer (20) is performed by means of a second UV photolithography operation to obtain the conducting tracks, and a superficial passivation insulating layer (24) is deposited on the conducting tracks.

2. The process for manufacturing a card with tips according to claim 1, wherein the flexible film of the substrate (10) is a polymer, in particular a polyimide, having a thickness greater than 25 microns.

3. The process for manufacturing a card with tips according to claim 1, wherein the first adhesive metal layer (20) is chrome- or nickel-based.

4. The process for manufacturing a card with tips according to claim 1, wherein the second metal layer (22) can be made of copper, gold or aluminium.

5. The process for manufacturing a card with tips according to claim 1, wherein the tips (26) obtained by electroforming present flat, concave or convex contact surfaces.

* * * * *